United States Patent

Wang

[11] Patent Number: 6,080,646
[45] Date of Patent: Jun. 27, 2000

[54] METHOD OF FABRICATING A METAL-OXIDE-SEMICONDUCTOR TRANSISTOR WITH A METAL GATE

[75] Inventor: Kun-Chih Wang, Tucheng, Taiwan

[73] Assignee: United Microelectronics Corp., Taipei, Taiwan

[21] Appl. No.: 09/081,423

[22] Filed: May 20, 1998

[30] Foreign Application Priority Data

Apr. 18, 1998 [TW] Taiwan ................................. 87105965

[51] Int. Cl.$^7$ ................... H01L 21/3205; H01L 21/4763
[52] U.S. Cl. ......................... 438/585; 438/301; 438/688
[58] Field of Search ................................. 438/585, 301, 438/688

[56] References Cited

U.S. PATENT DOCUMENTS

| | | | |
|---|---|---|---|
| 5,670,432 | 9/1997 | Tsai | 437/245 |
| 5,801,088 | 9/1998 | Gardner et al. | 438/585 |
| 5,923,999 | 7/1999 | Balasubramanyam et al. | 438/592 |
| 5,981,382 | 11/1999 | Konecni et al. | 438/646 |

*Primary Examiner*—John F. Niebling
*Assistant Examiner*—Alexander G. Ghyka
*Attorney, Agent, or Firm*—Thomas, Kayden, Horstemeyer & Risley

[57] ABSTRACT

A method of fabricating a MOS transistor having an aluminum gate is disclosed. On a MOS transistor having a polysilicon gate, an insulating layer is first formed. The device surface is then polished by CMP to expose the polysilicon gate. Then, an aluminum layer is formed on the substrate and then processed through annealing at more than 500° C. so that a portion of the aluminum layer substitutes the polysilicon gate to form an aluminum gate. After removing the substituted polysilicon and the non-reacted aluminum, the NMOS transistor with an aluminum gate is completed.

21 Claims, 2 Drawing Sheets

METHOD OF FABRICATING A METAL-OXIDE-SEMICONDUCTOR TRANSISTOR WITH A METAL GATE

CROSS-REFERENCE TO RELATED APPLICATION

This application claims the priority benefit of Taiwan application Ser. No. 87105965, filed Apr. 18, 1998, the full disclosure of which is incorporated herein by reference.

BACKGROUND OF THE INVENTION

1. Field of the Invention

The invention relates in general to a method of fabricating an integrated circuit (IC), and more particularly to a method of fabricating a metal-oxide-semiconductor (MOS) transistor with an aluminum gate instead of conventional polysilicon gate.

2. Description of the Related Art

MOS transistor is the most important elementary electric device for the vary large scale integration (VLSI) technique at present. It basically consists of stacked thin films of metal, oxide and semiconductor. Silicon is the major semiconductor source for the MOS transistor now. The oxide thin film is made from silicon oxide. As to the metal thin film, though aluminum is widely used for semiconductor devices, some drawbacks, such as difficulties in etching aluminum gate electrode during patterning and problems caused by backend thermal processes after forming aluminum gate electrode, makes the use of aluminum as the metal thin film improper. Moreover, the other metal materials are not used for the metal thin film of MOS transistor either since they mostly suffer from the problems of poor adhesive force with the silicon oxide thin film. Polysilicon, having superior adhesive force with the silicon oxide layer and compatible with the present process, is now the most commonly used material for the gate electrode. However, the problem of high resistance, even processed through doping, makes the use of polysilicon gate electrode limited. One of the solutions for overcoming high resistance is to form a metal silicide layer over the polysilicon gate.

Typically, MOS transistors have the following three categories: 1:n-channel MOS transistor(NMOS), 2.p-channel MOS transistor (PMOS) and 3.complementary MOS transistor (CMOS), whereas the NMOS is the most popular. FIG. 1 shows a cross-section of a conventional NMOS. First, an isolation region 102 is formed on the substrate 100 to isolate the adjacent MOS transistors. Next, a gate oxide layer 104 and a polysilicon gate electrode 106 are successively formed on the substrate 100.

Next, source/drain regions are formed to define the channel region of the MOS transistor. Usually, for the new generation of the memory and logic devices, lightly doped drain (LDD) is used to substitute the conventional source/drain structure so that hot carrier effect is prevented. The LDD structure is typically formed by the following steps: implanting low dosage of dopant into the substrate 100 to form lightly doped regions 108, forming spacer 110 around the polysilicon gate electrode 106, then, using the spacer 110 as a mask, implanting high dosage of dopant to form heavily doped regions 112.

To reduce the resistance of the polysilicon gate electrode 106 and the source/drain region 112, metal silicide layers 118 and 120 are formed on the polysilicon gate electrode 106 and source/drain regions 112, using self-aligned silicide technique. Then, after removing the unreacted and remained titanium, the NMOS transistor is completed.

However, as the integration of the IC is increased, the line width of the MOS transistor is reduced to submicron. The above-mentioned conventional process suffers from high gate resistance, gate tunnel leakage and poly gate deplection and therefore the performance of the MOS transistor is reduced.

SUMMARY OF THE INVENTION

It is therefore an object of the invention to provide a method of fabricating a MOS transistor with a metal gate electrode to avoid the poor performance due to polysilicon gate.

It is therefore another object of the invention to provide a method of fabricating a MOS transistor with a metal gate, using polysilicon-aluminum substitute to form a gate electrode to prevent the limitation in process caused by the conventional method for forming aluminum gate electrode.

The invention achieves the above-identified objects by providing a method of fabricating a MOS transistor having an aluminum gate. On a MOS transistor having a polysilicon gate, an insulating layer is first formed. The device surface is then polished by CMP to expose the polysilicon gate. Then, an aluminum layer is formed on the substrate and then processed through annealing at more than 500° C. so that a portion of the aluminum layer substitutes the polysilicon gate to form an aluminum gate. After removing the substituted polysilicon and the non-reacted aluminum, the NMOS transistor with an aluminum gate is completed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
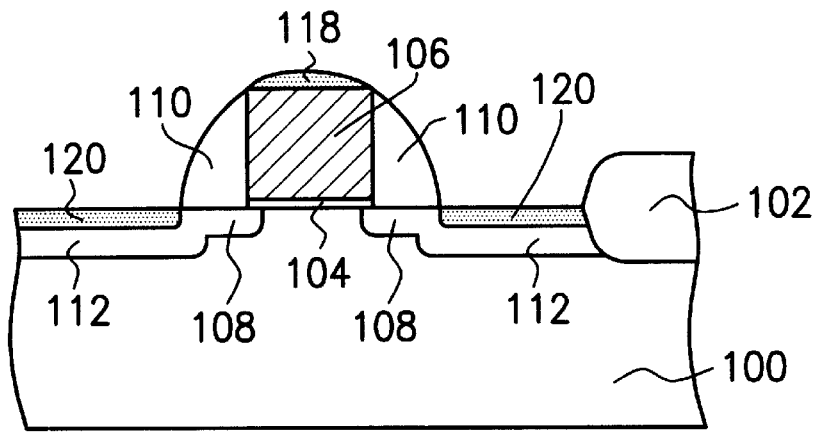
FIG. 1 shows a cross section of a conventional NMOS transistor.
Figure 2A:
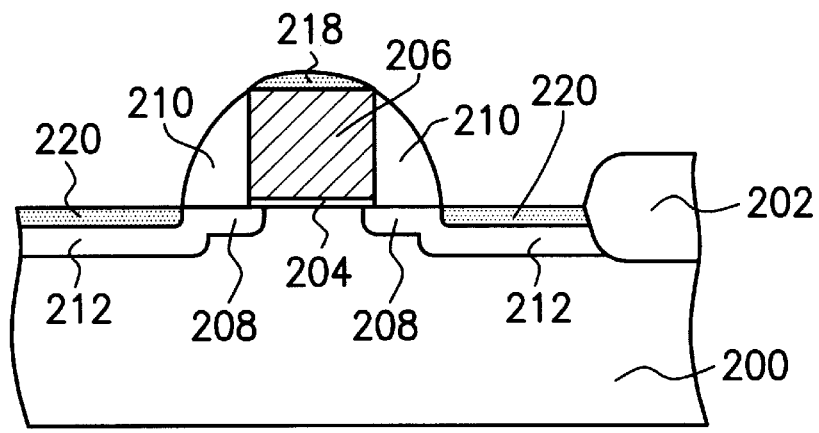
FIGS. 2A to 2D are cross-sectional views showing the process steps of fabricating a NMOS transistor according a preferred embodiment of the invention.

First, referring to FIG. 2A, on a provided substrate 200, such as a p-type substrate, an isolation region 202 is formed to isolate the adjacent MOS devices. The isolation region 202 can be typically formed by local oxidation of silicon (LOCOS) to form field oxide regions and define active regions. Alternatively, the isolation region 202 can be a shallow trench isolation structure (STI) formed by, for example, etching trenches in the substrate 200 and then filling oxide into the trenches by chemical vapor deposition (CVD). Next, a gate oxide layer 204 and a polysilicon layer 206 are successively formed. The material of the gate oxide layer 204 can be silicon oxide and the gate oxide layer 204 is preferrably formed by thermal oxidation. The polysilicon layer 206 is preferrably formed low pressure chemical vapor deposition (LPCVD). The polysilicon layer 206 do not have to be processed through neither conventional doping step to increase its conductivity nor the conventional anneal to activate dopants. After the formation of the gate oxide layer 204 and the polysilicon layer 206, a photolithography process and an etching step are performed to form the desired pattern of the gate.

Next, source/drain regions are formed to define the channel region of the MOS field effect transistor. Usually, for the new generation of the memory and logic devices, LDD structure is used instead of the conventional source/drain structure so that the hot carrier effect can be avoided. The LDD structure is typically formed by the following steps: implanting low dosage of dopant into the substrate 200 to form lightly doped regions 208, forming spacer 210 around the polysilicon gate electrode 206, then, using the spacer 210 as a mask, implanting high dosage of dopant to form heavily doped regions 212. The material of the spacer 210 preferably includes silicon oxide or silicon nitride. The spacer 210 can be formed by, for example, CVD and then anisotropic etching.

To reduce the resistance of the polysilicon layer 206 and the source/drain region 212, after the formation of the polysilicon layer 206 and the source/drain regions 212, self-aligned silicide technique is performed to form metal silicide layers 218 and 220 on the polysilicon layer 206 and the source/drain region 212, respectively. The metal silicide layers 218 and 220 are preferably tungsten silicide, titanium silicide or cobalt silicide. Titanium silicide is taken as an example to explain the formation method. The titanium silicide can be formed by first, for example, DC magnetron sputtering to form a titanium layer having a thickness of about 200 Å to 1000 Å on over the substrate 200. Then, a rapid thermal annealing (RTA) is performed at about 750° C. to transform the titanium layer directly contacting the polysilicon layer 206 and the source/drain regions 212 to a low resistance C-54 titanium silicide layer 218 and 220. Next, a wet etching process is performed, using hydrogen peroxide or ammonium hydroxide aqueous solution to remove the non-reacted titanium.

Figure 2B:
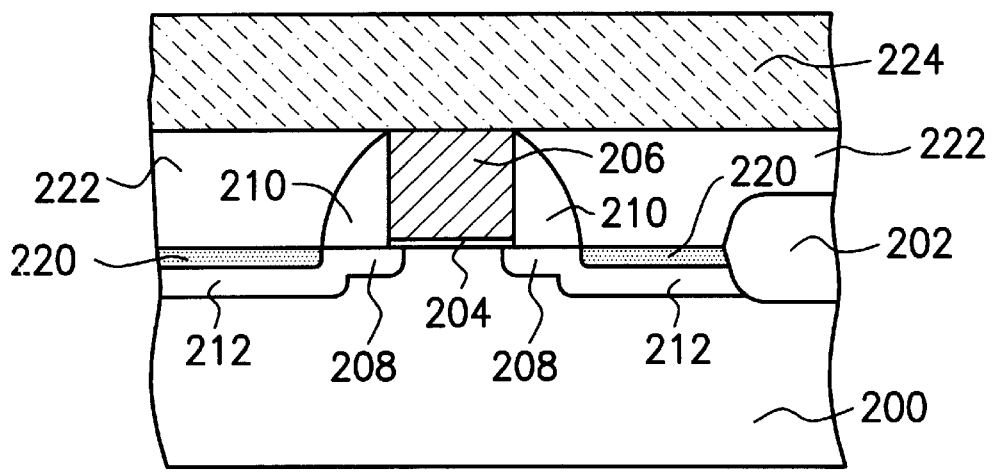

Then, referring to FIG. 2B, an insulating layer 222 is formed over the substrate 200 to expose the polysilicon layer 206. Then, an aluminum layer 224, preferably an Al-Si-Cu alloy layer, is formed on the substrate 200. The insulating layer 222 includes silicon nitride or silicon oxide, such as BPSG. The insulating layer 222 can be formed by CVD and then planarization, for example, chemical mechanical polish (CMP), to polish the device surface until exposing the surface of the polysilicon layer 206. The method of forming the aluminum layer 224 preferably includes physical vapor deposition (PVD), which is a sputtering process performed at a vacuum chamber, purged with argon of 1~10 mTorr, at about 500° C. The preferred thickness of the aluminum layer 224 is about 20KÅ.

Figure 2C:
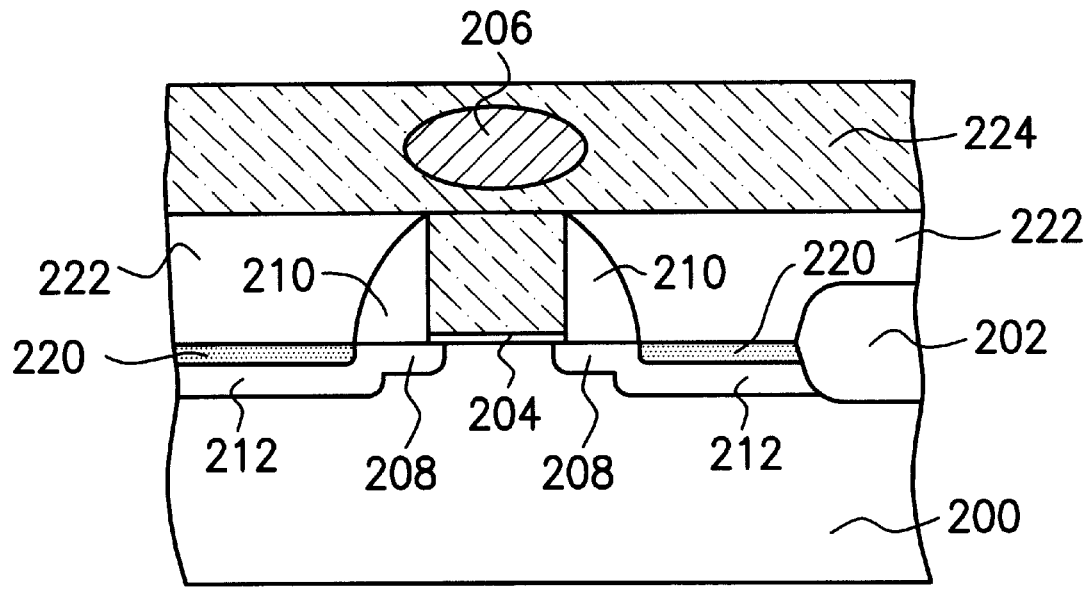

Then, referring to FIG. 2C, an annealing process is performed at a temperature of about 500° C., preferably at about 500° C., so that a portion of the aluminum layer 224 substitutes the polysilicon layer 206 to form polysilicon-aluminum substitute. The technique of forming polysilicon-aluminum substitute is described in detail in "Novel High Aspect Ratio Aluminum Plug for Logic/DRAM LSIs Using Polysilicon-Aluminum Substitution (PAS)", Hiroshi Horie, Masahiro Imai, Akio Itoh, and Yoshihiro Arimoto, IEDM '96, p.946.

Figure 2D:
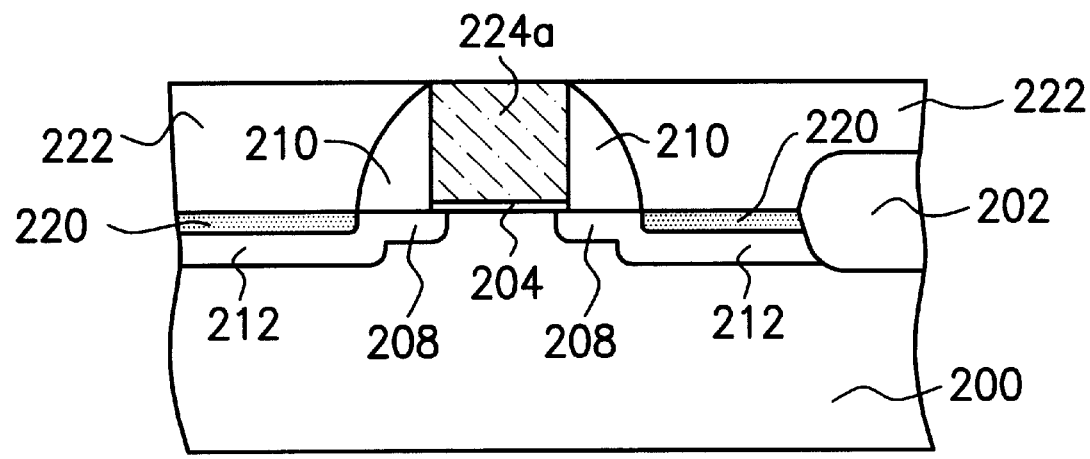

Then, referring to FIG. 2D, the substituted polysilicon layer 206 and the nonreacted aluminum 224 are removed preferably by CMP until the insulation layer 222 is exposed.

Consequently, it is obvious that the present has the following advantages:

1. Substitute reaction is able to take place between undoped polysilicon layer and aluminum. Thus, neither during the deposition of the polysilicon layer, nor after the deposition of the polysilicon layer, a further doping step is not required.

2. Using the aluminum gate instead of the polysilicon gate prevents the depletion effect and also reduces the gate electrode resistance. Therefore, the device performance is increased.

3. According to the invention, high conductivity aluminum is used as the material of gate electrode and the formation of metal silicide over the source/drain region reduce the resistance of the gate electrode and the source/drain region.

4. The aluminum gate electrode is formed after the formation of the metal silicide over the source/drain regions and also the continuing processes is performed at a temperature of less than 450° C. so that thermal budget is reduced the problem of aluminum melting is avoided.

5. The aluminum gate electrode of the invention is formed by substituting the patterned polysilicon so that metal gate etch issue is prevented.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a metal-oxide-semiconductor transistor with a metal gate, comprising the steps of:

providing a substrate having a MOS transistor formed thereon, wherein the MOS transistor has source/drain regions, a patterned gate oxide layer and a patterned polysilicon layer formed on the patterned gate oxide layer;

forming an aluminum layer at least on the patterned polysilicon layer;

performing an annealing process so that the aluminum layer substitutes the patterned polysilicon layer, wherein the patterned polysilicon is transported to form a transported polysilicon; and removing the transported polysilicon and a non-reacted portion of the aluminum layer to form a aluminum gate electrode.

2. A method as claimed in claim 1, wherein metal silicide layers are formed on the source/drain regions.

3. A method as claimed in claim 2, wherein the metal silicide layers comprises tungsten silicide, titanium silicide or cobalt silicide.

4. A method as claimed in claimed 1, wherein before said step of forming the aluminum layer, a step of forming an insulating layer which exposes the patterned polysilicon layer is further performed.

5. A method as claimed in claim 1, wherein the aluminum layer has a thickness of about 20KÅ.

6. A method as claimed in claim 1, wherein the aluminum layer is formed by physical vapor deposition.

7. A method as claimed in claim 1, wherein the aluminum layer is formed by sputtering.

8. A method as claimed in claim 1, wherein the annealing process is performed at a temperature of more than 500° C.

9. A method as claimed in claim 1, wherein the transported polysilicon and the non-reacted portion of the aluminum layer are removed by chemical mechanical polishing.

10. A method of fabricating a metal-oxide-semiconductor transistor with an aluminum gate, comprising the steps of:

providing a substrate having a MOS transistor formed thereon, wherein the MOS transistor has source/drain regions, a patterned gate oxide layer and a patterned polysilicon layer formed on the patterned gate oxide layer;

forming an insulating layer over the substrate which exposes an upper surface of the patterned polysilicon layer;

forming an aluminum layer at least on the patterned polysilicon layer;

performing an annealing process so that the aluminum layer substitutes the patterned polysilicon layer, wherein the patterned polysilicon is transported to form a transported polysilicon; and removing the transported polysilicon and a non-reacted portion of the aluminum layer to form a aluminum gate electrode.

11. A method as claimed in claim 10, wherein metal silicide layers are formed on the source/drain regions.

12. A method as claimed in claim 11, wherein the metal silicide layers comprises tungsten silicide, titanium silicide or cobalt silicide.

13. A method as claimed in claimed 10, wherein the insulating layer comprises silicon oxide.

14. A method as claimed in claimed 10, wherein the insulating layer comprises BPSG.

15. A method as claimed in claimed 10, wherein the insulating layer comprises silicon nitride.

16. A method as claimed in claim 10, wherein the insulating layer is planarized by chemical vapor deposition.

17. A method as claimed in claim 10, wherein the aluminum layer has a thickness of about 20KÅ.

18. A method as claimed in claim 10, wherein the aluminum layer is formed by physical vapor deposition.

19. A method as claimed in claim 10, wherein the aluminum layer is formed by sputtering.

20. A method as claimed in claim 10, wherein the annealing process is performed at a temperature of more than 500° C.

21. A method as claimed in claim 10, wherein the transported polysilicon and the non-reacted portion of the aluminum layer are removed by chemical mechanical polishing.

* * * * *